US010228117B2

(12) United States Patent
Sure et al.

(10) Patent No.: US 10,228,117 B2
(45) Date of Patent: Mar. 12, 2019

(54) AIR MIXING METHODOLOGY AND SYSTEM TO REDUCE THE TEMPERATURE OF LEDS OF A PHOTOCATALYTIC REACTOR

(71) Applicant: HONEYWELL INTERNATIONAL INC., Morris Plains, NJ (US)

(72) Inventors: Anita Sure, Karnataka (IN); Vighneswara Rao Kollati, Andhra Pradesh (IN); Raghuveer Hanumanthrao Desai, Karnataka (IN)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 510 days.

(21) Appl. No.: 14/935,075

(22) Filed: Nov. 6, 2015

(65) Prior Publication Data
US 2017/0130947 A1    May 11, 2017

(51) Int. Cl.
*F21V 29/503* (2015.01)
*H01L 25/075* (2006.01)
(Continued)

(52) U.S. Cl.
CPC .............. *F21V 29/503* (2015.01); *F21K 9/30* (2013.01); *H01L 25/0753* (2013.01); *H01L 33/642* (2013.01); *H05K 1/0209* (2013.01); *F21V 29/74* (2015.01); *F21V 29/83* (2015.01); *F21Y 2105/001* (2013.01); *F21Y 2105/16* (2016.08); *F21Y 2115/10* (2016.08); *H05K 1/05* (2013.01); *H05K 2201/09045* (2013.01); (Continued)

(58) Field of Classification Search
CPC ...... F21V 19/045; F21V 29/004; F21V 29/02; F21V 29/20; F21V 29/2212; F21V 29/503; F21V 29/70; F21V 29/74; F21V 29/767; F21V 29/777; F21V 29/83; H01L 23/3735
See application file for complete search history.

(56) References Cited

U.S. PATENT DOCUMENTS 6,045,240 A * 4/2000 Hochstein ............ B60Q 1/2696
362/249.06
6,301,779 B1   10/2001 Azar
(Continued)

FOREIGN PATENT DOCUMENTS

EP    2434246 A1   3/2012
FR    2983030 A1   5/2013
(Continued)

OTHER PUBLICATIONS

Ke Wu, Le Wang, Yi-Bo Yu, Zhi-Yi Huang, Luminaries-level structure improvement of LEDs for heat dissipation enhancement under natural convection, Sadhana, Dec. 2013, pp. 1357-1368, vol. 38, Part 6, Indian Academy of Sciences.
(Continued)

*Primary Examiner* — Hargobind S Sawhney
(74) *Attorney, Agent, or Firm* — Shimokaji IP

(57) ABSTRACT

An LED panel includes a support having a first side, a second side opposite the first side, and a window that extends from the first side to the second side. An LED is affixed to the first side. A diverter affixed to the second side. The diverter includes an angled portion, wherein the angled portion extends over a window portion that is less than all of the window.

10 Claims, 7 Drawing Sheets

(51) Int. Cl.
  *H01L 33/64* (2010.01)
  *H05K 1/02* (2006.01)
  *F21K 99/00* (2016.01)
  *H05K 1/05* (2006.01)
  *F21V 29/74* (2015.01)
  *F21V 29/83* (2015.01)
  *F21Y 105/16* (2016.01)
  *F21Y 115/10* (2016.01)
  *F21Y 105/00* (2016.01)

(52) U.S. Cl.
  CPC ............ *H05K 2201/09054* (2013.01); *H05K 2201/09063* (2013.01); *H05K 2201/10106* (2013.01)

(56) References Cited

U.S. PATENT DOCUMENTS

| | | | |
|---|---|---|---|
| 7,096,678 B2* | 8/2006 | Petroski | G06F 1/20 |
| | | | 257/E23.099 |
| 7,315,049 B2 | 1/2008 | Raos et al. | |
| 7,583,502 B2* | 9/2009 | Tsao | H01L 23/467 |
| | | | 165/121 |
| 2003/0230752 A1 | 12/2003 | Wu | |
| 2006/0042291 A1* | 3/2006 | Petroski | G06F 1/20 |
| | | | 62/264 |
| 2007/0262337 A1* | 11/2007 | Villard | F21K 9/00 |
| | | | 257/99 |
| 2007/0285890 A1* | 12/2007 | Tsao | H01L 23/467 |
| | | | 361/697 |
| 2009/0086436 A1 | 4/2009 | Kluge | |
| 2009/0303735 A1 | 12/2009 | Chen | |
| 2010/0202128 A1* | 8/2010 | Saccomanno | F21V 3/04 |
| | | | 362/84 |
| 2012/0057327 A1* | 3/2012 | Le | F21V 3/02 |
| | | | 362/84 |
| 2014/0104836 A1 | 4/2014 | Cree | |
| 2015/0138767 A1* | 5/2015 | Kwak | F21V 29/20 |
| | | | 362/235 |
| 2016/0341400 A1* | 11/2016 | Lee | F21V 29/67 |

FOREIGN PATENT DOCUMENTS

| | | |
|---|---|---|
| GB | 2515409 A | 12/2014 |
| KR | 2010102929 A | 9/2010 |
| WO | 2012164409 A1 | 12/2012 |
| WO | 2014037844 A1 | 3/2014 |

OTHER PUBLICATIONS

Search Report from EP application No. 16195877.2 dated Mar. 6, 2017.

* cited by examiner

AIR MIXING METHODOLOGY AND SYSTEM TO REDUCE THE TEMPERATURE OF LEDS OF A PHOTOCATALYTIC REACTOR

BACKGROUND OF THE INVENTION

The present invention generally relates to LEDs and, more particularly, to heat dissipation of LEDs.

LEDs dissipate around 70% of their input electrical energy in the form of heat. If this heat is not effectively taken away from the system, the LEDs soldering point would reach higher temperature during steady operation. Life and efficiency of LEDs decrease with temperature rise.

An approach used to dissipate heat from high-performance LED-chip packages uses metal-based PCBs that contain a central layer of aluminum or copper to spread heat.

Another approach to dissipate heat is an active cooling solution, such as fans. But they may not have the same life expectancy as the LED itself.

As can be seen, there is a need for improved apparatus and methods to dissipate heat from LEDs.

SUMMARY OF THE INVENTION

In one aspect of the present invention, an LED panel comprises a support having a first side, a second side opposite the first side, and a window that extends from the first side to the second side; an LED affixed to the first side; a diverter affixed to the second side; wherein the diverter includes an angled portion; wherein the angled portion extends over a window portion that is less than all of the window. With the diverter, the change or variation in pressure drop in the system can be minimal.

In another aspect of the present invention, an LED panel comprises a support having a first side, a second side opposite the first side, and a window that extends from the first side to the second side; an LED affixed to the first side; a diverter affixed to the second side; wherein the diverter includes an angled portion; wherein an angle between the angled portion and a plane of the window is an acute angle.

In yet another aspect of the present invention, an LED panel comprises a first panel having a first support having a first LED side and a first non-LED side; wherein the first substrate includes a first window; a first LED affixed to the first LED side; a second panel having: a second support having a second LED side and a second non-LED side; wherein the second non-LED side interfaces the first non-LED side; wherein the second substrate includes a second window; a second LED affixed to the second LED side; a diverter affixed to the second non-LED side; wherein the diverter includes an angled portion; wherein the angled portion extends over a second window portion that is less than all of the second window.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features. However, any single inventive feature may not address any of the problems discussed above or may only address one of the problems discussed above. Further, one or more of the problems discussed above may not be fully addressed by any of the features described below.

Generally, the present invention provides, in a housing, an LED panel array and LED panels therein that enable heat dissipation. The panel array can include one or more pairs of first and second LED panels. In the panel array, the first LED panel can transfer an air flow towards a second LED panel. The second LED panel can include diverter(s) that can divert the air flow along the surface of the second LED panel and/or allow the air flow to pass through a window(s) in the second LED panel. In embodiments, the present invention can provide a reduction in the second LED panel temperature, over prior art designs, by from about 7% to about 9%.

Figure 1A:
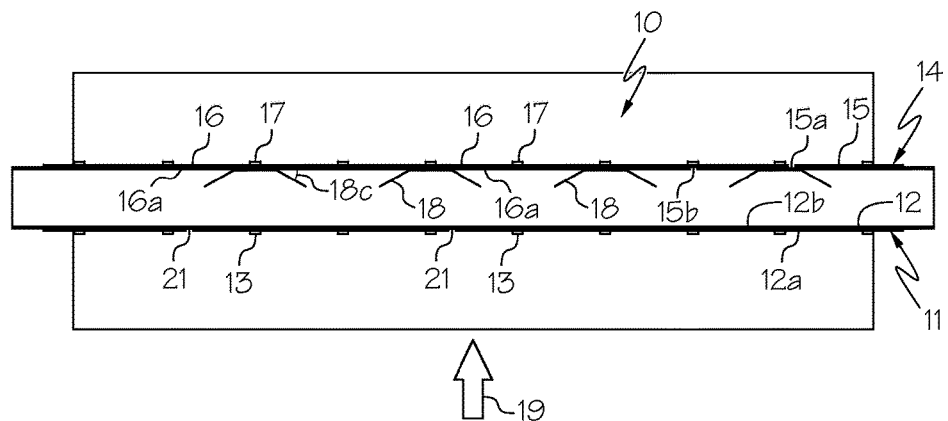
FIG. 1A is a top schematic view of an LED panel array according to an embodiment of the present invention.
Figure 1B:
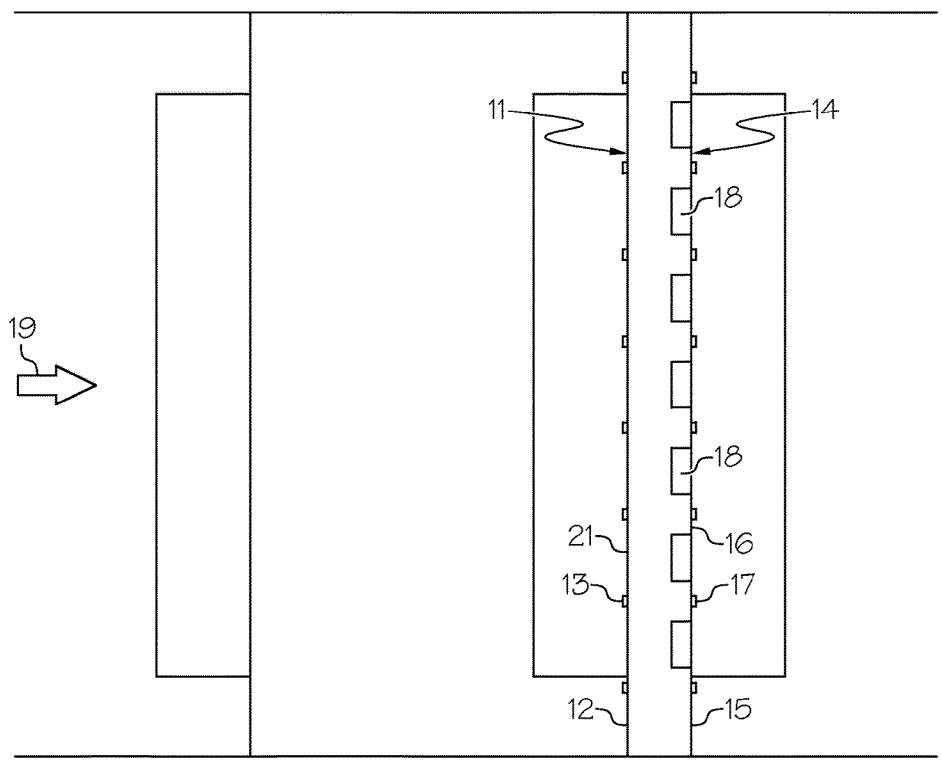
FIG. 1B is a side schematic view of the LED panel array in FIG. 1A.

In FIGS. 1A-1B, an exemplary embodiment of an LED panel array 10 is schematically depicted. For illustration purposes, the LED panel array 10 may include a first LED panel 11 and an interfacing second LED panel 14. However, the array 10 may include more than two LED panels. In embodiments, the LED panels may be disposed parallel to one another. In embodiments, the first LED panel 11 may be perpendicularly oriented to an air flow.

The first LED panel 11 may include a first support or substrate 12, such as a PCB made of any conventional material, such as a metal. The first substrate 12 may have a first LED side 12a and an opposed first non-LED side 12b. Similarly, the second LED panel 14 may include a second substrate 15, such as a PCB, a second LED side 15a, and a second non-LED side 15b. Thereby, the second non-LED side 15b faces towards each other the first non-LED side 12b.

On the first LED panel 11, one or more first LEDs 13 can be affixed, in a first LED array configuration, to the first LED side 12a. The first LEDs 13 can be of any conventional design. The first LED array configuration can include a random or non-random arrangement of LEDs. For example, the first LEDs 13 can be equally spaced from one another in rows and columns. In an embodiment, LEDs are absent on the first non-LED side 12b.

In an embodiment, the first LED panel 11 can include one or more first windows 21 (i.e., holes or openings) within the first LED array. In other words, the first LED panel 11 can have first windows 21 that are interspersed, either randomly or non-randomly, among the first LEDs 13. The first windows extend from the first LED side 12a, through the first substrate 12, and to the first non-LED side 12b. In an embodiment, the first windows 21 can be in a first window array configuration whereby each window 21 can be equally spaced from one another in rows and columns. In an embodiment, LEDs are absent on the first non-LED side 12b The second LED panel 14 can include a support or substrate 15, such as a PCB made of any conventional material, such as a metal. On the second LED panel 14, one or more second LEDs 17 can be affixed, in a second LED array configuration, to the second LED side 15a. The second LEDs 17 can be of any conventional design. The second LED array configuration can include a random or non-random arrangement of LEDs. For example, the second LEDs 17 can be equally spaced from one another in rows and columns. In an embodiment, LEDs are absent on the second non-LED side 15b.

In the second LED panel 14, one or more second windows (i.e., openings or holes) 16 can extend from the second LED side 15a, through the second substrate 15, and to the second non-LED side 15b. The second windows 16 can be arranged in a window array configuration wherein the configuration can include a random or non-random arrangement of windows. For example, the second windows 16 can be equally spaced from one another in rows and columns. The second windows 16 can be characterized by a window plane 16a that lies in a plane of the second non-LED side 15b. In other words, the window 16 extends from the non-LED side 15b to the LED side 15a, and each side lies in a respective plane. Thus, the window 16 also lies in the planes of both sides 15a, 15b. Since a "side" of the window 16 lies in a plane of the non-LED side 15b, the window 16 also has a window plane 16a.

In an embodiment, the first LEDs 13 can be aligned with the second LEDs 17 in both x and y directions. In other embodiments, the first windows 21 can be aligned with the second windows 16 in both x and y directions.

Figure 2A:
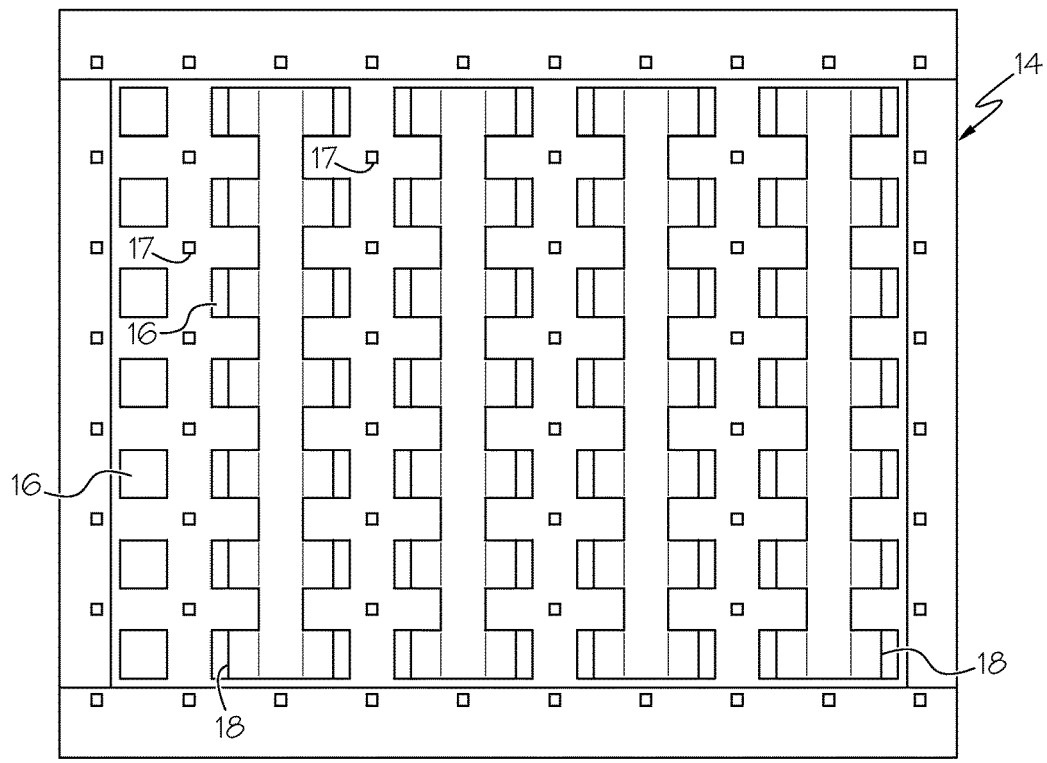
FIG. 2A is a front view of an LED panel according to an embodiment of the present invention.
Figure 2B:
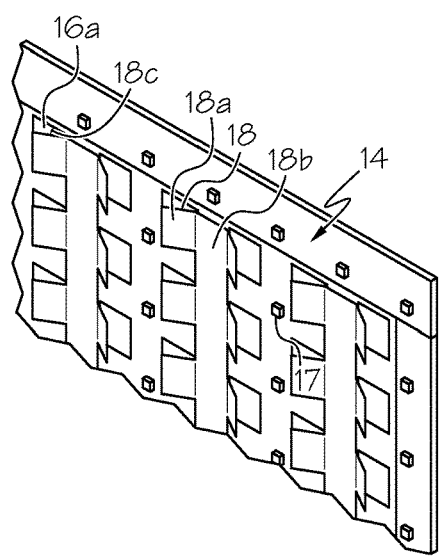
FIG. 2B is a partial perspective view of the LED panel in FIG. 2A.

In FIGS. 2A-2B, on the second LED panel 14, one or more diverters 18 can be affixed to and/or integral with the second non-LED side 15b. One or more of the diverters 18 can include one or more angled portions 18a that extend from one or more base portions 18b. The base portion 18b can be affixed to the second non-LED side 15b. In an embodiment, as shown in FIG. 2A, a single diverter 18 can include a single base portion 18b with multiple angled portions 18a that extend from opposing edges of the base portion 18b. In an embodiment, the angled portions 18a are equally spaced from one another along each edge of the base portion 18b.

One or more of the angled portions 18a can extend from the base portion 18b in such a way that the angled portion 18a extend across or over only a portion of a second window 16, and not all of the second window 16 (FIG. 2A). In various embodiments, the angled portion 18a may only extend over about 13% to about 74% of a window 16, thus leaving about 87% to about 26% of the window open (i.e., uncovered or unobstructed).

In an embodiment, one or more of the angled portions 18a can be positioned relative to the window plane 16a at an acute angle 18c. In embodiments, the acute angle can be from about 30° to about 75°. Alternatively, in embodiments, the angled portion 18a can be positioned relative to the base portion 18b at an obtuse angle from about 105° to about 150°. In further alternatives, the angled portion 18a may be angled to an impinging air flow 19 described below between about 30° to about 60°. In embodiments, one or more the diverters 18 can be made by bending the LED substrate 15.

Figure 3:
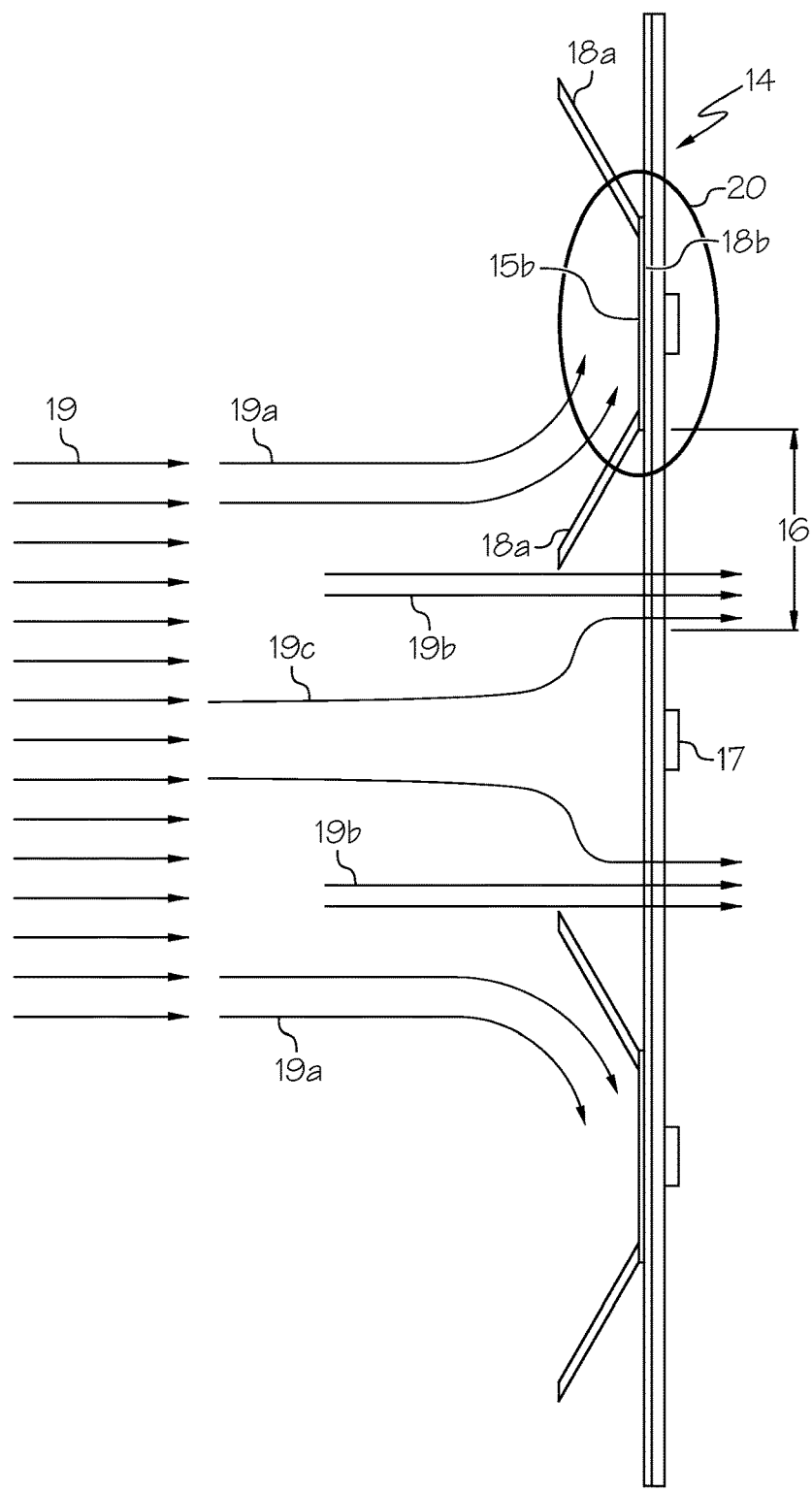
FIG. 3 is a partial side schematic view of an LED panel according to an embodiment of the present invention.

FIG. 3 schematically depicts a possible mechanism of heat dissipation according to an embodiment of the present invention. However, the scope of the present invention is not intended to be limited by such mechanism. In this embodiment, the diverter 18 includes angled portions 18a along each opposing edge of the base portion 18b. Air 19 can emanate from the first LED panel 11. As the air 19 meets or contacts a diverter 18, an air portion 19a of the heated air may contact an angled portion 18a, thereby directing the air portion 19a along the second non-LED side 15b, and more specifically, along the base portion 18b. Such area of flow along the base portion 18b is depicted by the encircled area 20 and can be referred to as the heat convection area because it is believed that in such area 20 heat transfer by convection occurs.

At the same time, or even at a different time, an air portion 19b does not contact the angled portion 18a, thereby flowing from the first LED panel 11 and straight or directly into the uncovered portion of the window 16. At the same time, or even at a different time, an air portion 19c does not contact the angled portion 18a, thereby flowing from the first LED panel 11 to contact the second non-LED side 15b, and thus indirectly flowing into the uncovered portion of the window 16. In embodiments, with the diverter(s) 18, the change or variation in pressure drop in the system can be minimal.

Figure 4:
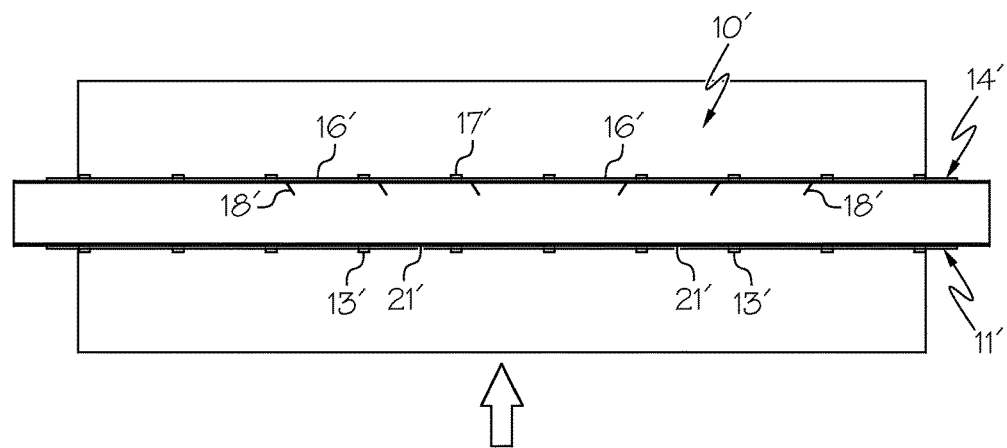
FIG. 4 is a is a top schematic view of an LED panel array according to another embodiment of the present invention.

FIG. 4 schematically depicts an alternative embodiment of an LED panel array 10'. The array 10' can be the same as the panel array 10, except that the diverter 18' in the former array differs. The diverter 18' includes multiple angled portions 18a', but only along one edge of the base portion 18b.

Figure 5:
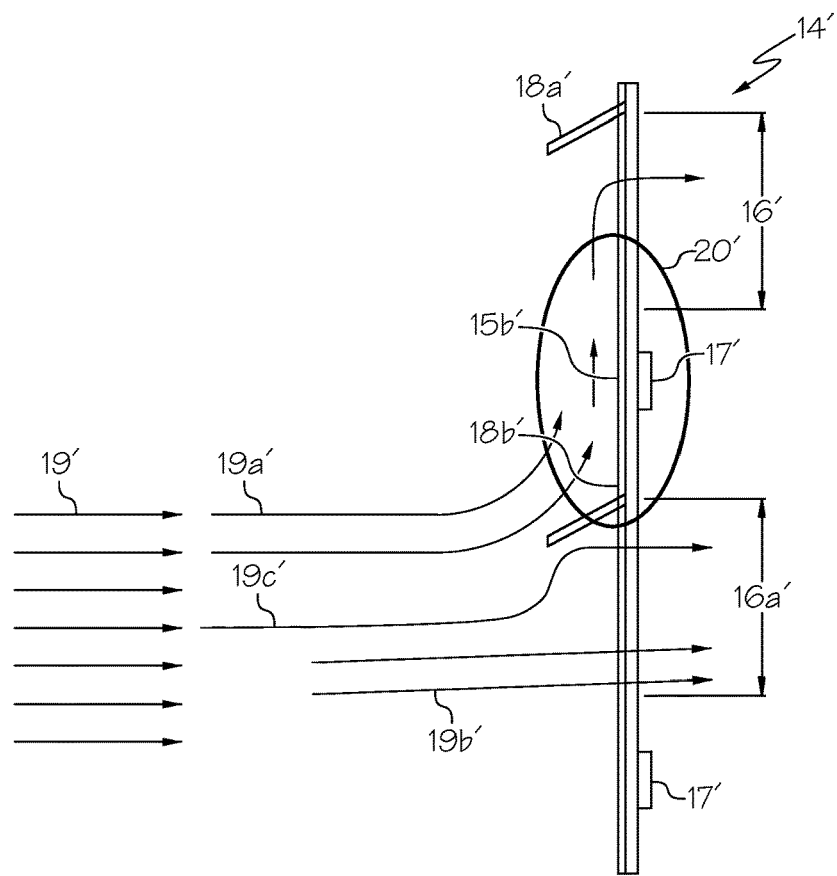
FIG. 5 is a partial side schematic view of an LED panel according to another embodiment of the present invention.

FIG. 5 schematically depicts a possible mechanism of heat dissipation according to the embodiment of the present invention shown in FIG. 4. Air 19' can emanate from the first LED panel 11. As the air meets or contacts a diverter 18', an air portion 19a' of the air 19' may contact an angled portion 18a', thereby directing the air portion 19a' along the second non-LED side 15b', and more specifically, along the base portion 18b'. The area in which the air portion 19a' moves along the base portion 18b' can be referred to as the heat convection area 20'. The air portion 19a' may then continue to flow out of the heat convection area 20' and into the uncovered portion of a window 16', which is unlike the embodiment of FIG. 3.

At the same time, or even at a different time, an air portion 19b' does not contact the angled portion 18a', thereby flowing from the first LED panel 11 and straight or directly into the uncovered portion of the window 16'. At the same time, or even at a different time, an air portion 19c' does not contact the angled portion 18a', but flows along the angled portion 18a' that interfaces the window plane 16a', and into the covered portion of the window 16'.

EXAMPLES

Figure 6A:
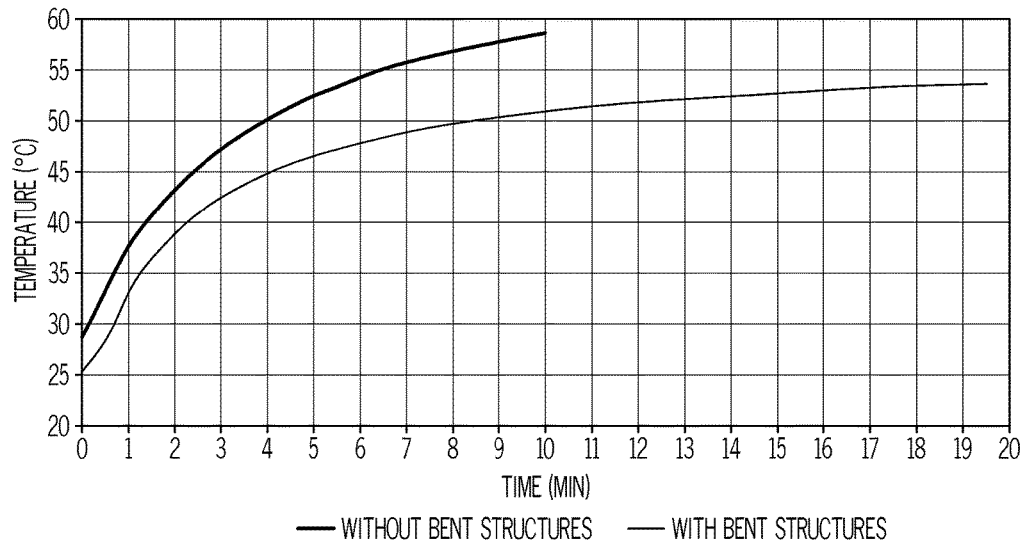
FIG. 6A is a graph of temperature versus time, at a given set of operating parameters, that compares the present invention to the prior art.
Figure 6B:
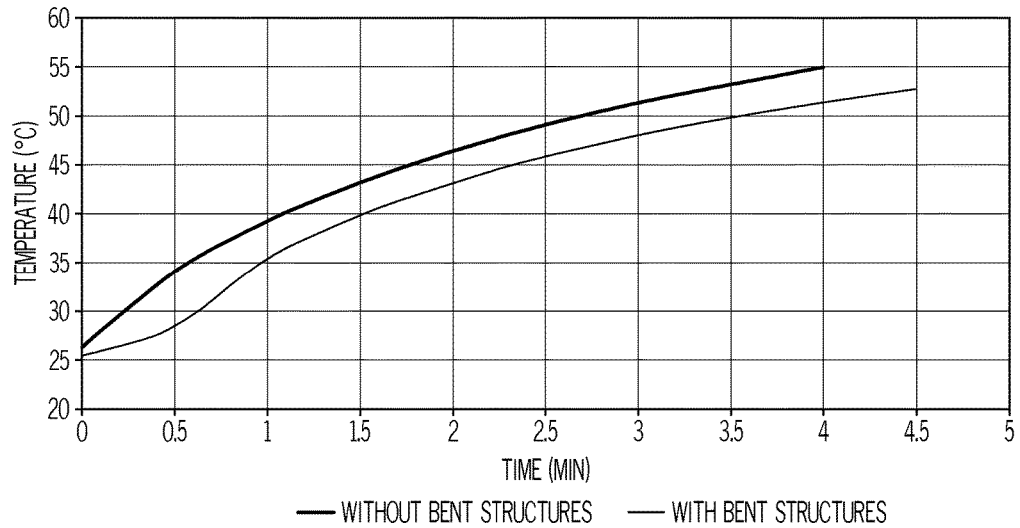
FIG. 6B is a graph of temperature versus time, at a another set of operating parameters, that compares the present invention to the prior art.
Figure 6C:
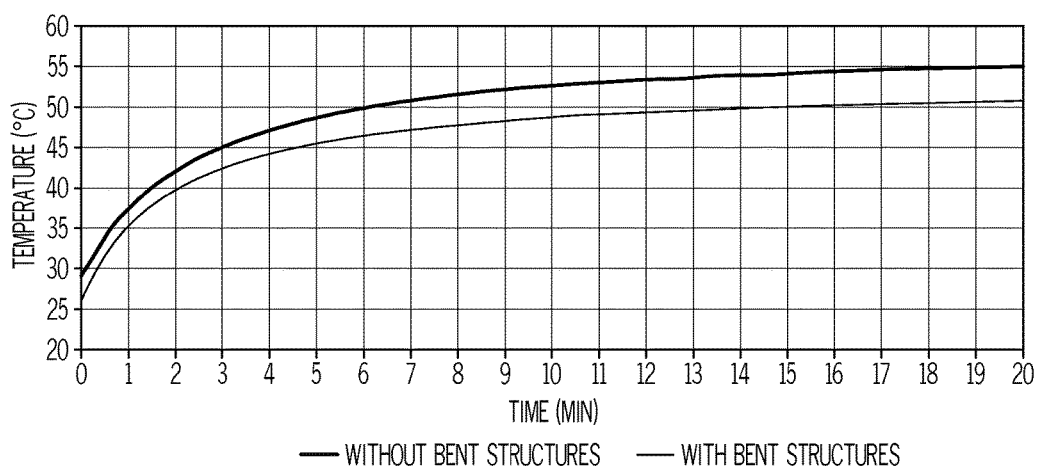
FIG. 6C is a graph of temperature versus time, at yet another set of operating parameters, that compares the present invention to the prior art.

FIGS. 6A-6C are graphs of temperature versus time of comparative results, under three different operating conditions, for an LED panel without a diverter and the LED panel with the diverter shown in FIG. 1A. It can be seen that over time, the present invention provides a lower operating temperature.

Figure 7A:
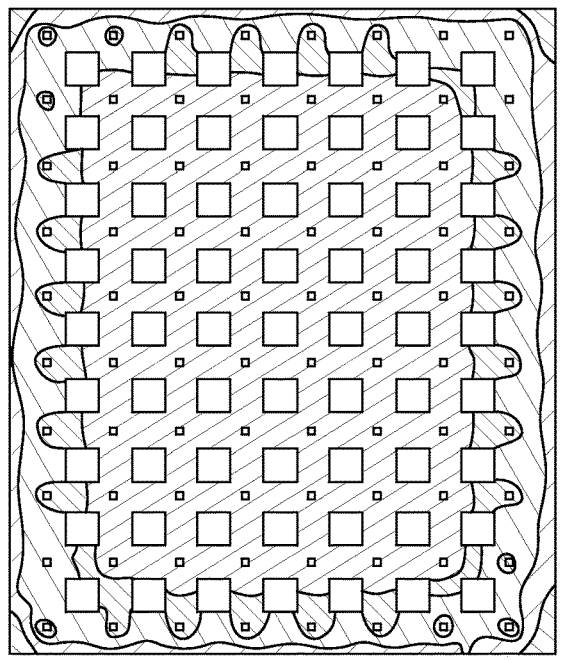
FIG. 7 is a graph of temperature versus position on an LED panel that compares the present invention to the prior art.
Figure 7B:
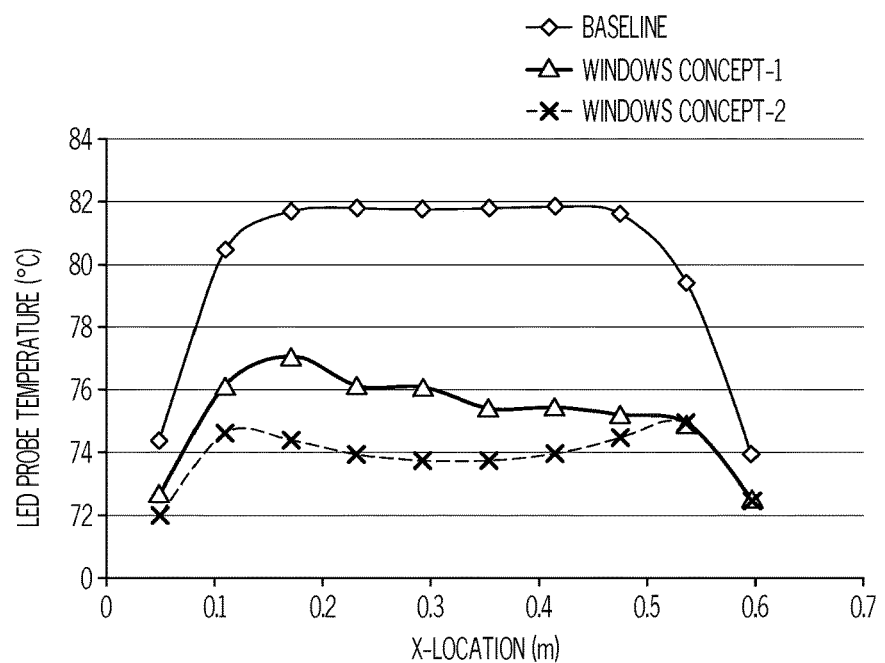

FIG. 7 is a graph of temperature versus location along an axis of LED panels with diverters according to the embodiments shown in FIGS. 1A and 4, and an LED panel without diverters. For the embodiment of FIG. 1A, the present invention provided a lower operating temperature of about 6° C. in the central part of the panel. For the embodiment of FIG. 4, the present invention provided a lower operating temperature of about 8° C. in the central part of the panel. Thus, the present invention can provide a reduction in the second LED panel temperature, over prior art designs, by from about 7% to about 9%.

It should be understood, of course, that the foregoing relates to exemplary embodiments of the invention and that modifications may be made without departing from the spirit and scope of the invention as set forth in the following claims.

We claim:

1. An LED panel, comprising:
    a support having a first side, a second side opposite the first side, and a window that extends from the first side to the second side;
    a plurality of LEDs affixed to the first side;
    a plurality of air flow diverters affixed to the second side; and
    a plurality of windows that extend between the first and second sides;
    wherein, on the first side, the LEDs are disposed alternately with the windows;
    wherein, on the second side, the diverters are disposed alternately with the windows.

2. The LED panel of claim 1, wherein at least one of the plurality of diverters includes only one angled portion.

3. The LED panel of claim 1, wherein at least one of the plurality of diverters include two angled portions.

4. The LED panel of claim 1, wherein the diverters are integral with the support.

5. An LED panel array, comprising:
    a first panel having
        a first substrate having a first LED side and a first non-LED side;
        wherein the first substrate includes a first window;
        a first LED affixed to the first LED side;
    a second panel having:
        a second substrate having a second LED side and a second non-LED side;
        wherein the second non-LED side interfaces the first non-LED side;
        wherein the second substrate includes a second window;
        a second LED affixed to the second LED side;
        an air flow diverter affixed to the second non-LED side;
        wherein the diverter includes an angled portion;
        wherein the angled portion extends over a second window portion that is less than all of the second window.

6. The array of claim 5, wherein the first panel is substantially parallel to the second panel.

7. The array of claim 5, wherein the first panel is substantially perpendicular to an air flow.

8. The array of claim 5, wherein the first window is aligned with the second window.

9. The array of claim 5, wherein the first LED is aligned with the second LED.

10. The array of claim 5, wherein the diverter includes a base portion affixed to the angled portion.

* * * * *